(12) United States Patent
Zhou et al.

(10) Patent No.: US 11,762,958 B1
(45) Date of Patent: Sep. 19, 2023

(54) MARKOV DECISION PROCESS BASED RECIPE GENERATION FOR MULTI-CHIP APPARATUS

(71) Applicant: XILINX, INC., San Jose, CA (US)

(72) Inventors: Ran Zhou, San Jose, CA (US); Cinti X. Chen, Fremont, CA (US); Xiao-Yu Li, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 905 days.

(21) Appl. No.: 16/591,179

(22) Filed: Oct. 2, 2019

(51) Int. Cl.
*G06F 9/44* (2018.01)
*G06N 20/00* (2019.01)
*G01R 31/28* (2006.01)
*G06F 30/34* (2020.01)
*G06F 18/20* (2023.01)

(52) U.S. Cl.
CPC .......... *G06F 18/295* (2023.01); *G01R 31/2831* (2013.01); *G06F 30/34* (2020.01); *G06N 20/00* (2019.01)

(58) Field of Classification Search
CPC ....... G06K 9/6297; G06N 20/00; G06F 30/34; G01R 31/2831
USPC ................................................ 717/100-108
See application file for complete search history.

(56) References Cited

U.S. PATENT DOCUMENTS

| | | | |
|---|---|---|---|
| 9,224,384 B2 | 12/2015 | Bapat | |
| 10,707,138 B1 | 7/2020 | Xiong et al. | |
| 10,769,347 B1* | 9/2020 | Schuermyer | G06N 20/00 |
| 2018/0322242 A1 | 11/2018 | Burke et al. | |
| 2019/0064253 A1 | 2/2019 | David et al. | |
| 2019/0188578 A1* | 6/2019 | Manoharan et al. | G06Q 20/4016 |
| 2019/0378098 A1* | 12/2019 | Lam et al. ............. | G06Q 20/40 |

* cited by examiner

*Primary Examiner* — Chuck O Kendall
(74) *Attorney, Agent, or Firm* — Patterson + Sheridan, LLP

(57) ABSTRACT

Examples described herein provide for determining a recipe for identifying from which buckets integrated circuit chips are taken to form units of a multi-chip apparatus. In an example, a method uses a processor-based system and uses a Markov Decision Process. Buckets are defined based on respective characteristics of manufactured chips. Each of the manufactured chips is binned into a respective one of the buckets based on the characteristic of the respective manufactured chip. A recipe for identifying from which of the buckets to take one or more of the manufactured chips to incorporate into respective ones of the units of the multi-chip apparatus is generated.

20 Claims, 4 Drawing Sheets

US 11,762,958 B1

MARKOV DECISION PROCESS BASED RECIPE GENERATION FOR MULTI-CHIP APPARATUS

TECHNICAL FIELD

Examples of the present disclosure generally relate to generating a recipe for a multi-chip apparatus and systems for generating such a recipe and, in particular, to generating a recipe for a multi-chip apparatus using a Markov Decision Process and systems for generating such a recipe.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multifunctional device. By having different chips, in some instances, semiconductor processing that is difficult to integrate can be separated, such as when parts of one chip require high temperature processing whereas parts of another chip cannot withstand high temperature processing. Another aspect is an ability to build a System in Package (SiP) by having chips with different functionalities (for example, some are field programmable gate array (FPGA) chips and some are memory chips) into a same apparatus with a smaller device size and more functionality and lower power. Additionally, semiconductor processes for a chip can be more focused to give devices a greater edge in areas such as increased performance of the chip, reduced costs, and increased yield in manufacturing. Other benefits can be realized by such apparatuses.

SUMMARY

Examples described herein provide for determining a recipe for identifying from which buckets integrated circuit chips are taken to form units of a multi-chip apparatus. Some examples described herein introduce a Markov Decision Process as a basic principle and practical solution for a chip bucket selection process in forming units of a multi-chip apparatus.

An example of the present disclosure is a method of forming units of a multi-chip apparatus. The method uses a processor-based system and uses a Markov Decision Process. Buckets are defined based on respective characteristics of manufactured chips. Each of the manufactured chips is binned into a respective one of the buckets based on the characteristic of the respective manufactured chip. A recipe for identifying from which of the buckets to take one or more of the manufactured chips to incorporate into respective ones of the units of the multi-chip apparatus is generated.

Another example of the present disclosure is a recipe generation system that includes a processor and a memory coupled to the processor. The memory stores instruction code, and the processor is configured to execute the instruction code to perform operations. The operations use a Markov Decision Process and include: (i) define buckets based on respective characteristics of manufactured chips; (ii) bin each of the manufactured chips into a respective one of the buckets based on the characteristic of the respective manufactured chip; and (iii) generate a recipe for identifying from which of the buckets to take one or more of the manufactured chips to incorporate into respective ones of the units of the multi-chip apparatus.

Another example of the present disclosure is a method for manufacturing. Chips are manufactured on wafers. A characteristic of each of the chips is obtained by testing each of the chips. A subset of the wafers from which chips are to be taken to form units of a multi-chip apparatus is selected. Each of the chips of the subset of the wafers is binned into a respective bucket of a plurality of buckets based on the characteristic of the respective chip. A recipe that identifies from which of the buckets to take one or more chips to incorporate into respective ones of the units of the multi-chip apparatus is generated. Generating the recipe includes using a Markov Decision Process. The units of the multi-chip apparatus are formed, and forming the units includes incorporating chips taken from respective buckets identified by the recipe.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
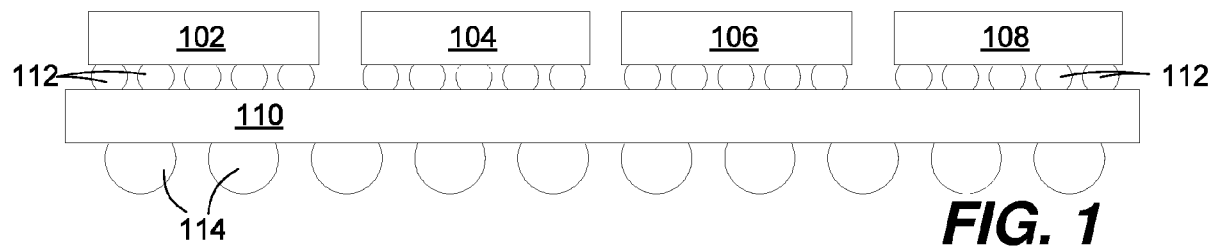
FIG. 1 is a block diagram of a multi-chip apparatus, such as a two-and-a-half-dimensional integrated circuit (2.5DIC) apparatus, according to some examples.

Examples described herein provide determining a recipe for identifying from which buckets integrated circuit chips are taken to form units of a multi-chip apparatus. Some examples described herein introduce a Markov Decision Process as a basic principle and a solution for a chip bucket selection process for forming units of a multi-chip apparatus. Markov Decision Process is a theoretical framework of reinforcement learning, which can find an optimized strategy to maximize a reward under identified constraints. For chip bucket selection, the reward can be generated to maximize an amount of chips consumed for forming units of a multi-chip apparatus. At the same time, a generated recipe can also meet power and performance specifications without violating process constraints. A recipe can include actions to be taken that are determined by the Markov Decision Process. Once the learning process is completed and the algorithm converges, a maximum reward can be given for an optimized recipe. Additionally, the Markov Decision Process can be a solution to a dynamic binning process, where chips can be assigned to one of a number of buckets that are dynamically defined based on characteristics of the chips and power and performance speciation of the multi-chip device.

As the semiconductor industry moves to advanced technology nodes, for example, nodes at 28 nm or smaller, such as small as 7 nm or 5 nm, Moore's Law approaches physical limits of devices. These physical limits can create a barrier to increasing density and device speed while reducing device power consumption based on scaling device dimensions. Various approaches to increase device densities and speed while reducing power consumption have been investigated. Some approaches include multi-core computing, multi-dimensional chip stacks, and interposer and boardlevel technologies. How to select multiple chips and pack chips into an integrated apparatus is a challenge.

An existing algorithm is to use a fixed and limited number of buckets for each speed grade of a chip. The chips on each wafer are separated into a fixed number of bin buckets and put in a chip bank. When chips are selected for assembly into a multi-chip apparatus, a recipe calls for the chips in each bucket, which are assembled into a multi-chip apparatus. This bin bucket procedure is an extra constraint on the selection process. This is because once a chip is assigned into a bucket, the corresponding characteristic (e.g., static power consumption and performance) of the chip is treated as being a worst-case scenario defined by an upper limit of the bucket. For example, with static power consumption, if a bucket has a power limit of 6.3, each chip in the bucket will be evaluated or analyzed as having the power of 6.3, even if the actual power reading of the chip is as low as 4.3. A chip with a characteristic that is less pessimistic than the worst-case can be selected with a chip from some other bins with other limits (e.g., higher in the example with static power consumption and performance) and still meet the specification.

Therefore, the pessimistic approach to selecting chips for a multi-chip apparatus has led to low yield where a number of chips are not useable and/or are not consumed in forming units of the multi-chip apparatus. For example, in some cases, many high power chips are unable to be selected with lower power chips because some lower power chips lost their lower power readings and only are labelled by their upper power limit of the bucket to which the respective chip is assigned. In other words, the high power chips lost the opportunity to be selected due to the power increase in the bucketing process that is limited by how many bin buckets are available and the upper power limit of each bin bucket.

Techniques and processor-based systems for identifying from which buckets chips are to be taken for forming units of a multi-chip apparatus have been implemented previously. However, these techniques and processor-based systems have proven to be problematic. There are at least two problems to current techniques. First, a Greedy algorithm is used to identify from which buckets chips are to be taken, which can only find the best decision for each single step. There is not a feasible mechanism to balance immediate rewards and cumulative rewards. Therefore, there is no guarantee that a Greedy algorithm converges to a global optimized solution. Second, fixed recipes being generated might not be the best for each specific case. Accordingly, a technical problem existed in that no processor-based system was available to identify a globally optimized solution for identifying from which buckets chips are to be taken for forming units of a multi-chip apparatus. Further, a technical problem existed in that previous processor-based systems were constrained by fixed bucket definitions that treated each chip as a worst-case scenario according to an upper limit of the bucket to which the chip was assigned.

Some examples provide a solution to one or more of these problems by providing techniques and processor-based systems that implement a Markov Decision Process as the framework to describe yield as a function of decisions being made in each selection step. A Markov Decision Process can determine an optimized policy that provides improved cumulative rewards and enables consumption of the most chips with the least number of chips remaining unconsumed. A reward is a function of the strategy and can follow the Bellman optimality equation. Some examples can determine a global solution without being trapped in a local maxima. Further, using a Markov Decision Process, dynamic binning can be performed and accommodated.

Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a block diagram of a multi-chip apparatus, such as a two-and-a-half-dimensional integrated circuit (2.5DIC) apparatus, according to some examples. The 2.5DIC apparatus includes a first chip 102, a second chip 104, a third chip 106, and a fourth chip 108, each attached to an interposer 110 or another substrate. In other examples, the 2.5DIC apparatus may have fewer or more chips. Each of the first chip 102, second chip 104, third chip 106, and fourth chip 108 can be or include an integrated circuit (IC), such as a system-on-chip (SoC) and/or memory for storing data. The first chip 102, second chip 104, third chip 106, and fourth chip 108 are attached to the interposer 110 by electrical connectors 112, such as microbumps, metal pillars (e.g., copper pillars), or the like. Electrical connectors 114 are on a side of the interposer 110 opposite from the chips 102, 104, 106, 108 for attaching the 2.5DIC apparatus to another substrate, such as a package substrate, for example. The electrical connectors 114 may be controlled collapse chip connection (C4) bumps, ball grid array (BGA) balls, or the like.

The interposer 110 includes electrical interconnects that electrically connect various ones of the chips 102, 104, 106, 108. The electrical interconnects can include one or more metallization layers or redistribution layers on the side of the interposer 110 on which the chips 102, 104, 106, 108 are attached, one or more Through Substrate Vias (TSVs) through the bulk substrate (e.g., silicon substrate) of the interposer 110, and/or one or more metallization layers or redistribution layers on the side of the interposer 110 opposing the side on which the chips 102, 104, 106, 108 are attached. Hence, various signals, packets, etc. can be communicated between various ones of the chips 102, 104, 106, 108.

In other examples, more or fewer chips may be included, and the chips may be in other configurations. For example, more or fewer chips that include a SoC may be implemented, such as two, three, five, or more chips, and more or fewer memory chips may be included. In some examples, the multi-chip apparatus can include various stacked chips, such as in a three-dimensional IC (3DIC) apparatus. For example, two or more memory chips may be stacked on each other with the bottom memory chip being attached to the interposer 110. Other multi-chip apparatuses may be implemented in other examples, such as without an interposer. Various modifications may be made that would be readily apparent to a person having ordinary skill in the art.

Figure 2:
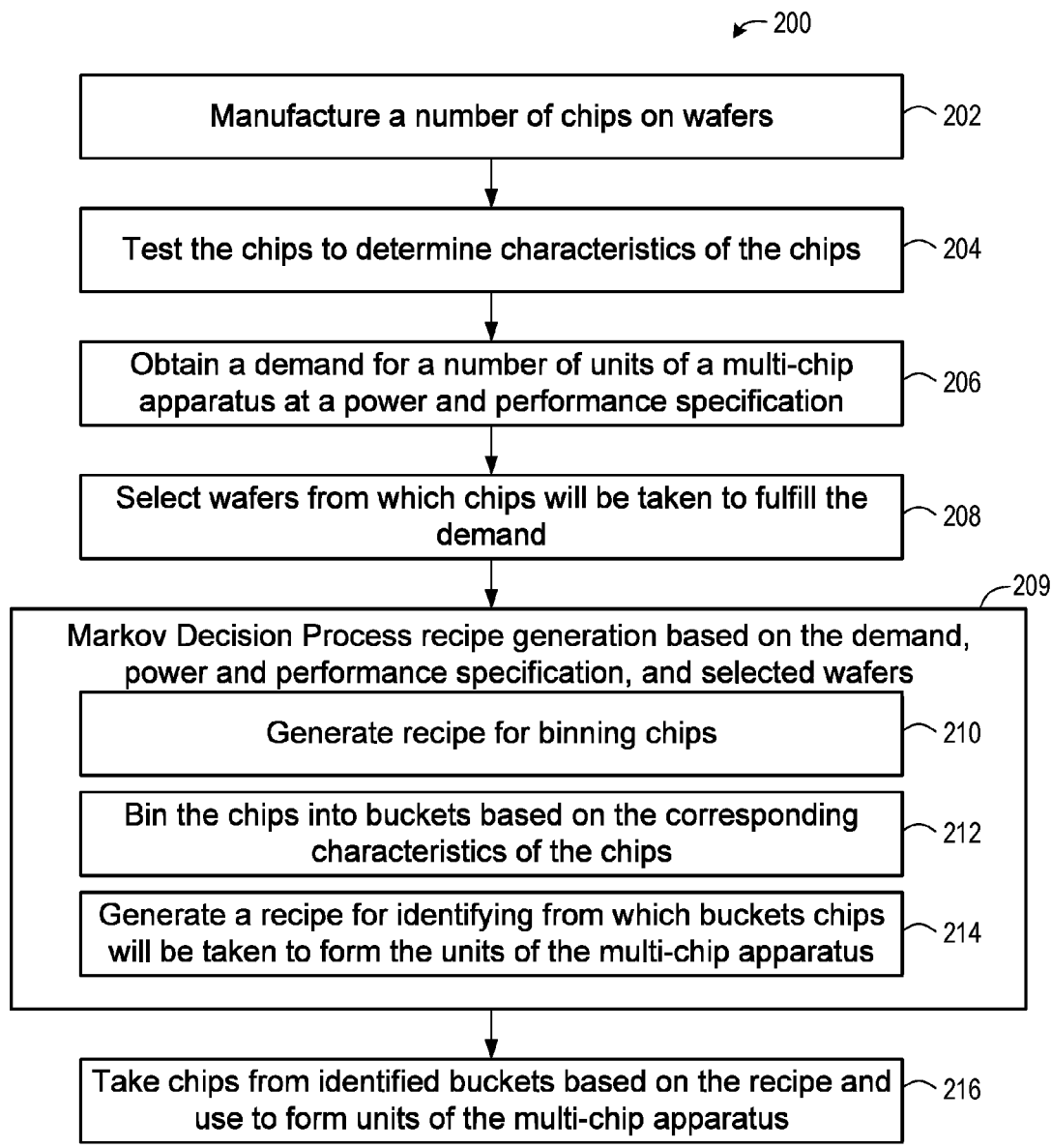
FIG. 2 is a flowchart of a method for forming units of a multi-chip apparatus according to some examples.

FIG. 2 is a flowchart of a method 200 for forming units of a multi-chip apparatus according to some examples. The multi-chip apparatus can generally have the form of the multi-chip apparatus of FIG. 1, in some examples. In other examples, a multi-chip apparatus can have any structure that can be formed by selecting which chips can be included within the apparatus.

At block 202, a number of chips are manufactured on wafers. Any number of wafers can be processed to manufacture any number of chips. The chips can be manufactured on and/or as part of a wafer (e.g., as respective dies), and each functional die (e.g. known good die) is capable of being singulated from other die(s) on the same wafer. Once singulated, the chips are capable of being integrated into a multi-chip apparatus. The chips can remain unsingulated from the wafer during various subsequent operations.

At block 204, the chips are tested to determine one or more characteristics of each chip. The testing can be a wafer sorting test, such as including specific functional tests such as input/output (IO) testing, phase-locked loop (PLL) testing, digital signal processing (DSP) testing, central processing unit (CPU) testing, multigigabit transceiver (MGT) testing, etc. The characteristics can include, for example, static power consumption, operating voltage, leakage, operating speed grade, performance, temperature grade, or a combination thereof. Each chip on each wafer has corresponding characteristics attached for subsequent analysis. In some examples, each chip can be characterized by a speed grade (e.g., "-1", "-2", or "-3"), a temperature range requirements (e.g., Extended ("E") (0° C. to 100° C.) or Industrial ("I") (-40° C. to 100° C.)), and an operating voltage (e.g., nominal voltage (no indication) (0.85 V) or low voltage ("L") (0.72 V)). Some example characterizations can be "-2I", "-2LE", "-1LI", and "-1E".

At block 206, a demand for a number of units of a multi-chip apparatus at a power and performance specification is obtained. The demand for a number of units of the multi-chip apparatus determines a minimum demand for a number of chips. For example, if a multi-chip apparatus includes four chips, and 100 units of the multi-chip apparatus are demanded (e.g., ordered by a customer), then at least 400 chips are demanded to fulfill the demand for the 100 units of the multi-chip apparatus.

At block 208, wafers are selected. The selected wafers are the wafers from which chips may be taken for fulfilling the demand. The selection of wafers can be based on the characteristics of the chips. The selection can be based on a Greedy algorithm or another algorithm using any of the characteristics of the chips obtained at block 202. The selection can attempt to maximize yield while fulfilling the demand. The wafers may be maintained in, e.g., a wafer bank from the time the wafers are processed.

At block 209, a Markov Decision Process is performed for recipe generation based on the demand, power and performance specification, and selected wafers. In some examples, the recipe generation uses a reinforcement learning method formulated as a Markov Decision Process. For example, a Markov Decision Process can be implemented by solving a Bellman equation using a State-Action-Reward-State-Action (SARSA) algorithm, a Q-learning algorithm, or any other appropriate algorithm. Further description of an example SARSA algorithm for generating a recipe is described below. The Markov Decision Process can attempt to optimize a strategy that determines how to dynamically define buckets and assign chips to those buckets, and that determines a recipe for identifying from which buckets chips are taken for forming units of the multi-chip apparatus. The Markov Decision Process, as implemented by an algorithm, can be iteratively performed such that the strategy converges to a stable solution with some degree of confidence.

Generally, the recipe generation using the Markov Decision Process can take, as inputs, the characteristics of the chips (as determined at block 204) of the selected wafers (as selected at block 208) and the demand and power and performance specification (as obtained at block 206). The power and performance specification can be a constraint on the permissible actions that can be determined by the Markov Decision Process, as described in further detail below. For example, the chips to be taken from identified buckets for any given unit of the multi-chip apparatus are to meet the power and performance specification. The Markov Decision Process can, using these inputs, generate a recipe for binning chips at block 210, bin the chips of the selected wafers into buckets corresponding to the characteristics of the chips at block 212, and generate a recipe for identifying from which buckets chips will be taken to form the units of the multi-chip apparatus at block 214.

Figure 3:
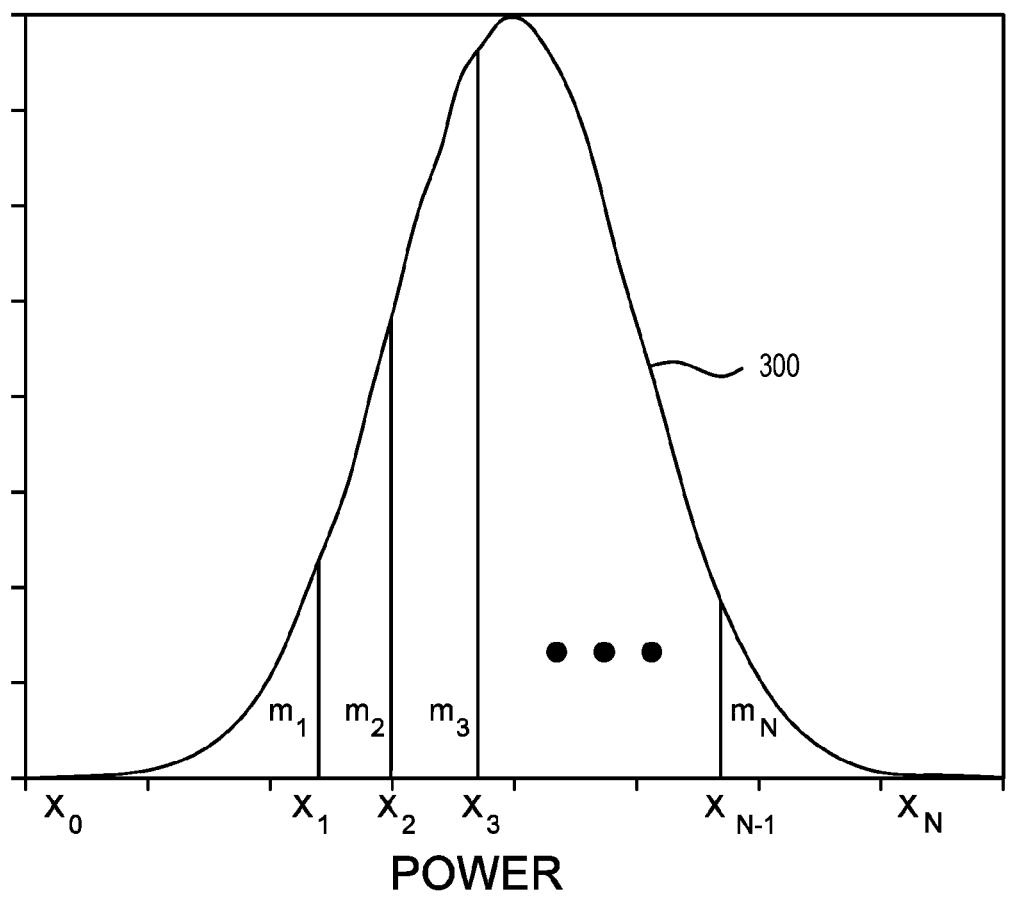
FIG. 3 is a distribution of static power consumption for available chips according to some examples.

At block 210, a recipe for binning chips is generated. The recipe defines buckets into which chips are capable of being binned. The Markov Decision Process can dynamically define the buckets. As described in further detail below, the buckets can be defined by states in the Markov Decision Process. The states generally include a number of chips in a given bucket, and hence, as part of the algorithm, the states can determine respective definitions of buckets based on the characteristics of the selected wafers. The states can define, e.g., power ranges for respective buckets. The buckets can vary wafer-to-wafer, lot-to-lot, and/or demand-to-demand. As an example, FIG. 3 illustrates a distribution 300 of static power consumption for available chips on selected wafers according to some examples. The distribution 300 can be a Gaussian distribution. Buckets $m_1$, $m_2$, $m_3$, ... $m_N$ can be determined based on the distribution. Bucket $m_1$ is in a power range from $x_0$ to $x_1$; bucket $m_2$ is in a power range from $x_1$ to $x_2$; bucket $m_3$ is in a power range from $x_2$ to $x_3$; and bucket $m_N$ is in a power range from $x_{N-1}$ to $x_N$. The Markov Decision Process can determine buckets defined with any range. In some examples, the buckets can have equal power ranges through the distribution. In some examples, the buckets can have respective power ranges such that a number of chips to be binned in each bucket is equal. In some examples, a bucket can be defined for each power range outside of, e.g., two standard deviations from the expected value of the distribution (e.g., bucket $m_1$ can be defined for a power range where $x_1$ is at a negative two standard deviations from the expected value, and bucket $m_N$ can be defined for a power range where $x_{N-1}$ is at a positive two standard deviations from the expected value), and the power ranges of buckets therebetween can be set to be equal. Any number of buckets can be implemented, and correspondingly, any range along a distribution can be implemented for any of the buckets. More buckets that are generated can result in smaller ranges along the distribution. This can result in increased precision in the recipe generation described below.

At block 212, the chips of the selected wafers are binned into the buckets based on the corresponding characteristics of the chips. The chips can be binned into the buckets as a natural result of defining the buckets of the states of the Markov Decision Process. As an example, the available chips of the wafers selected at block 208 are binned into buckets based on the static power consumption measured for the respective chips at block 204. In some examples, chips categorized at one speed are binned in buckets separate from buckets in which chips categorized at another speed are binned.

At block 214, a recipe for identifying from which buckets chips will be taken to form the units of the multi-chip apparatus is generated. The recipes can be defined as actions to be taken in the Markov Decision Process. For example, from which buckets chips are to be taken can be represented by the actions to be taken. The resulting determined actions from the Markov Decision Process can be the recipe for identifying from which buckets chips will be taken.

The selection of wafers of block 208 and the recipe generation using a Markov Decision Process of block 209 (including blocks 210-214) can be performed by a processor-based system, such as a computer. Further, the operations of blocks 208-214 can be performed by a same processor-based system or can be distributed variously across any number of processor-based systems.

At block 216, chips are assigned into power buckets based on the recipe and are used to form the units of the multi-chip apparatus. The chips can be singulated from the selected wafers. A pick-and-place tool can move a singluated chip to an interposer, and a reflow process can attach selected chips to the interposer. The recipe identifies from which bucket a chip is taken for attaching to the interposer. Any chip within an identified bucket can be selected.

In some examples, a Markov Decision Process (MDP) for generating a recipe is implemented by optimizing a Bellman equation using a SARSA algorithm. A number of variables and functions are listed below.

S is a set of states s.

A is a set of actions a.

$\pi(a|s)$ is a policy that identifies a probability of taking an action a at a given state s.

$\mathcal{P}^a_{ss'}$ is a transition probability of transitioning to state s′ starting from a given state s and taking a given action a;

$$\mathcal{P}^a_{ss'} = P(s_{t+1} = s'|s_t = s, a_t = a).$$

$r_t$ is a reward at time t.

$\mathcal{R}^a_{ss'}$ is an expected (or mean) immediate reward from transitioning to state s′ starting from a state s due to taking an action a;

$$\mathcal{R}^a_{ss'} = \mathbb{E}\left[r_{t+1}|s_t = s, s_{t+1} = s', a_t = a\right].$$

$\gamma$ is a discount factor to balance immediate and future rewards; $0 \leq \gamma \leq 1$.

$G_t$ is a cumulative return at time t discounted by the discount factor $\gamma$;

$$G_t = \sum_{k=0}^{\infty} \gamma^k r_{t+k+1}.$$

$V^\pi(s)$ is a state value function that is the expected value of a cumulative return $G_t$ when starting from a state s and acting according to a policy $\pi(a|s)$;

$$V^\pi(s) = \mathbb{E}_\pi\left[G_t|s_t = s\right].$$

$Q^\pi(s, a)$ is an action value function that is the expected value of a cumulative return $G_t$ given a state s and an action a under a policy $\pi(a|s)$;

$$Q^\pi(s, a) = \mathbb{E}_\pi\left[G_t|s_t = s, a_t = a\right].$$

The state value function $V^\pi(s)$ and the action value function $Q^\pi(s, a)$ can also be restated as Equations (1) and (2) below according to the Bellman equations.

$$V^\pi(s) = \sum_a \pi(a|s) Q^\pi(s, a) \qquad \text{Eq. (1)}$$

$$Q^\pi(s, a) = \sum_{s'} \mathcal{P}^a_{ss'}\left[\mathcal{R}^a_{ss'} + \gamma V^\pi(s')\right] \qquad \text{Eq. (2)}$$

Substituting Equation (2) into Equation (1) yields Equation (3) below, and substituting Equation (1) into Equation (2) yields Equation (4) below.

$$V^\pi(s) = \sum_a \pi(a|s) \sum_{s'} \mathcal{P}^a_{ss'}\left[\mathcal{R}^a_{ss'} + \gamma V^\pi(s')\right] \qquad \text{Eq. (3)}$$

$$Q^\pi(s, a) = \sum_{s'} \mathcal{P}^a_{ss'}\left[\mathcal{R}^a_{ss'} + \gamma \sum_a \pi(a|s') Q^\pi(s', a)\right] \qquad \text{Eq. (4)}$$

Figure 4:
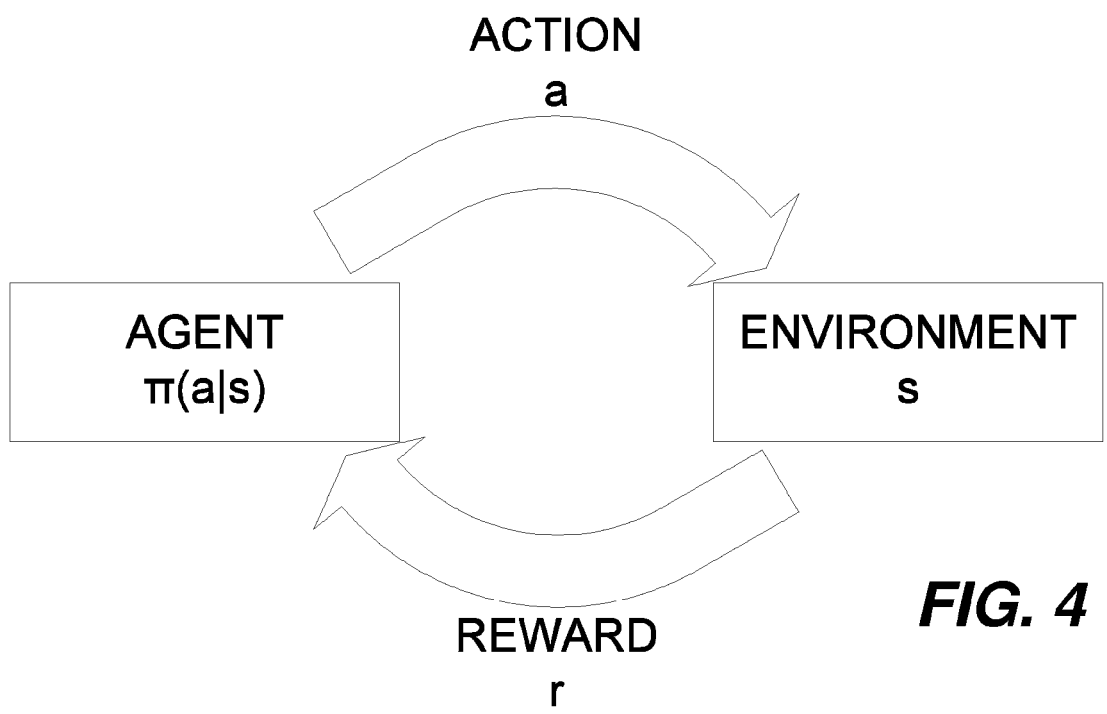
FIG. 4 is a general conceptual model for formulating a Markov Decision Process according to some examples.

To provide further general explanation of the above variables, FIG. 4 illustrates a general conceptual model for formulating a Markov Decision Process. The model includes an environment and an agent. The agent stays in a state s of the environment at any given time t. The agent determines which action a to take following the policy distribution $\pi(a|s)$. The environment is transitioned to a subsequent state s′ based on the transition probability $\mathcal{P}^a_{ss'}$. The transition probability $\mathcal{P}^a_{ss'}$ is determined by the action a, the state s, the subsequent state s′, and the environment. As a result, the agent receives an immediate reward r at the subsequent time t + 1. Reinforcement learning seeks to identify a strategy (e.g., actions to be taken) that maximizes the cumulative return $G_t$, which can discount future rewards.

In the context of generating a recipe to determine from which buckets chips are selected in the described example, each state s includes or is a number of chips in each bucket at a given time t. The states are dynamically determined and define the buckets such that the states can include or be a number of chips in any given bucket. For example, at a given time t with chips being binned into four buckets, a first bucket M1 has 10 chips; a second bucket M2 has 12 chips; a third bucket M3 has 17 chips; and a fourth bucket M4 has 15 chips. The state s at that given time t can be represented as $s_t$ = ($C_{M1}$, $C_{M2}$, $C_{M3}$, $CM_4$,) = (10,12,17,15), where $C_{Mi}$ is the number of chips in bucket Mi. For example, at some subsequent time t + 2, the first bucket M1 has 9 chips; the second bucket M2 has 10 chips; the third bucket M3 has 13 chips; and the fourth bucket M4 has 14 chips. The state s at that subsequent time t + 2 can be represented as $s_{t+2}$ = (9,10,13,14). The set S of states, as an example, includes the states $s_t$, $s_{t+1}$, and $s_{t+2}$.

In the context of generating a recipe to determine from which buckets chips are taken in the described example, an action a is a permissible selection of chips from buckets at a given time t to form and be included in a unit of a multi-chip apparatus. The actions can be constrained by the power and performance specification (e.g., chips in respective buckets that when matched together do not meet the power and performance specification may not be a permissible selection of chips for a unit of the multi-chip apparatus). Continuing the example from above relating to the states $s_t$ and $s_{t+2}$, example actions a could occur to transition from state $s_t$ to state $s_{t+2}$. An example action a at time t could be taken when the state $s_t$ is present, for a four chip multi-chip apparatus, to take one chip from the first bucket M1, one chip from the second bucket M2, and two chips from the third bucket M3, which can be represented as $a_t$ = (M1, M2, M3, M3). A subsequent example action a at subsequent time t + 1 could be taken, for a four chip multi-chip apparatus, to take one chip from the second bucket M2, two chips from the third bucket M3, and one chip from the fourth bucket M4, which can be represented as $a_{t+1}$ = (M2, M3, M3, M4). These example actions $a_t$ and $a_{t+1}$ can be taken to transition from $s_t$ = (10,12,17,15) to $s_{t+1}$ = (9,11,15,15) and then to $s_{t+2}$ = (9,10,13,14).

The reward r at any given time t is the number of chips consumed transitioning from a state s at a previous time t - 1 to another state s at the time t. Continuing with the example states $s_t$ and $s_{t+2}$ and actions $a_t$ and $a_{t+1}$ described above, the reward r at each of time t + 1 and time t + 2 is four chips consumed (e.g., $r_{t+1}$ = 4 and $r_{t+2}$ = 4).

Assuming chips are binned in buckets, the set S of states and set A of actions can be established. The set S of states can include each permissible permutation of numbers of chips in each bucket based on the number of chips to be consumed in units of a multi-chip apparatus. For example, if the state $s_t$ = (10,12,17,15) is the initial state after binning chips, and each multi-chip apparatus includes four chips, (9,10,13,14) may be a permissilbe permutation (as illustrated above), whereas (8,10,12,14) may not be a permissible perumutation since ten dies would have to be consumed, which is not a multiple of the four chips included in a multi-chip apparatus (e.g., a non-integer number of actions a would occur). Additionally, based on the binning, which chips from which buckets, including in which combination, are permissible for a unit of a multi-chip apparatus can be established. A chip from one bucket may not be able to be included in a multi-chip apparatus with a chip from another bucket based on the power and performance specification, e.g., because chips from the two buckets are characterized at different speeds and/or operate at significantly different speeds and do not meet the power and performance specification. The set A of actions can establish which combinations of chips of buckets are permissible.

With the set S of states and set A of actions being established, the transition probability $\mathcal{P}_{ss'}^a$ can be a discrete variable. Given a specified state s and a specified action a to be taken, the subsequent state s' naturally follows such that the transition probability $\mathcal{P}_{ss'}^a$ for that subsequent state s', given the specified state s and specified action a, is one, and the transition probabilities for other subsequent states s', given the same specified state s and same specified action a, are zero. For example, given s = (10,12,17,15) and a = (M1, M2, M3, M3), s' = (9,11,15,15) such that $\mathcal{P}_{ss'}^a$ = 1 for this s'. Further, for all other subsequent states s', $\mathcal{P}_{ss'}^a$ = 0 since given the state s and action a, the environment cannot transition to any of those subsequent states s'.

In some examples, the discount factor $\gamma$ can be set to one to give equal priority to immediate rewards and future rewards. The discount factor $\gamma$ can be set to other amounts.

According to some examples, an analysis is performed to maximize the action value function $Q^\pi(s, a)$ and/or the state value function $V^\pi(s)$ to determine a sequence of actions a that form a recipe. In some examples, the action value function $Q^\pi(s, a)$ is maximized by maximizing Equation (4) or an approximation of Equation (4). In some examples, the state value function $V^\pi(s)$ is maximized by maximizing Equation (3) or an approximation of Equation (3).

The action value function $Q^\pi(s, a)$ and/or the state value function $V^\pi(s)$ can be maximized using a numerical analysis. An example numerical analysis that can be implemented is a SARSA algorithm, although other algorithms can be implemented. The pseudocode below illustrates an example for determining an action value function $Q^\pi(s, a)$ and strategy (e.g., actions to be taken) by a SARSA algorithm that uses an approximation of Equation (4).

```
(1)  Initialize, arbitrarily, Q^π(s,a) ∀s ∈ S, a ∈ A;
(2)  Set Q^π (s = terminal state,) = 0;
(3)  Repeat (for each episode) {
(4)    Initialize s;
(5)    Choose a based on s using π(a|s) dervied from Q^π(s,a);
(6)    Repeat (for each step of episode) {
(7)      Take a;
(8)      Observe R^a_{ss'}, s';
(9)      Choose a' based on s' using π(a'|s') derived from Q^π(s',a')
(10)     Q^π(s,a) ← Q^π(s,a) + a[R^a_{ss'} + yQ^π(s',a') - Q^π(s,a)]
(11)     s ← s'; a ← a';
(12)   Until s is terminal;
(13)  }
(14) }
```

The policy $\pi(a|s)$ can be arbitrarily initially established before beginning the SARSA algorithm. For example, given a state s, the respective probabilities of the policy $\pi(a|s)$ can be set to be equal for the actions a that are capable of being taken. As an example, if the given state is s = (0,X,X,X) and some actions require a chip from the first bucket M1 (e.g., a = (M1,X,X,X)), then the policy $\pi(a|s)$ for those actions is zero (e.g., $\pi$((M1, X, X, X)|(0, X, X, X)) = 0, and the policy $\pi(a|s)$ for other actions that are capable of being taken are set to equal probabilities that sum to 1.

At line (1) of the above pseudocode, the action value function $Q^\pi(s, a)$ is arbitrarily initialized. The action value function $Q^\pi(s, a)$ can be initialized to any value since the SARSA algorithm attempts to converge the action value function $Q^\pi(s, a)$ to a maximum solution. At line (2), the action value function $Q^\pi(s, a)$ is set to zero for a terminal state indicating that no more chips are available to be consumed (for example, that all chips have been consumed).

Line (3) begins a loop that includes lines (3) through (14). Each iteration of the loop is for an episode of the algorithm. At line (4), the state is initialized to the state s that indicates the binning of chips. At line (5), an action a is chosen based on the current state s using the policy $\pi(a|s)$ that is derived from the action value function $Q^\pi(s, a)$. The action a can be chosen using an epsilon Greedy algorithm (e.g., ∈-Greedy), for example. The policy $\pi(a|s)$ is updated based on the action value function $Q^\pi(s, a)$ at the iteration. The action value function $Q^\pi(s, a)$ can change by steps of the episode as to be described subsequently, and hence, the policy $\pi(a|s)$ can be updated based on the changed action value function $Q^\pi(s, a)$.

Line (6) begins a nested loop that includes lines (6) through (13). Each iteration of the nested loop is for a step of a respective episode of the algorithm. The current action is taken at line (7), and the expected immediate reward $\mathcal{R}_{ss'}^a$ and subsequent state s′ are observed at line (8). At line (9), a subsequent action a′ is chosen based on the subsequent state s′ using the policy $\pi(a|s)$ that is derived from the action value function $Q^\pi(s', a')$. The subsequent action a′ can be chosen using an epsilon Greedy algorithm (e.g., ∈-Greedy), for example. The policy $\pi(a|s)$ is updated based on the action value function $Q^\pi(s', a')$ at the iteration. The action value function $Q^\pi(s', a')$ can change by steps of the episode, and hence, the policy $\pi(a|s)$ can be updated based on the changed action value function $Q^\pi(s', a')$.

Line (10) sets the action value function $Q^\pi(s, a)$ to be equal to (a) the action value function $Q^\pi(s, a)$ plus (b) an experience factor α times a sum of (i) the expected immediate reward $\mathcal{R}_{ss'}^a$, (ii) the discount factor γ times the subsequent action value function $Q^\pi(s', a')$, and (iii) a negative of the action value function $Q^\pi(s, a)$. The experience factor α can be a value $0 \leq \alpha \leq 1$. An experience factor α that approaches 1 can prioritize or weight recent or newer experience more than older experience, and an experience factor α that approaches 0 can prioritize or weight older experience more than recent or newer experience. Line (10), in the context of the loop and nested loop, can approximate Equation (4) above.

At line (11), the state s is updated to be the observed subsequent state s′, and the action a is updated to be the chosen subsequent action a′. Line (12) indicates the condition for continuing the nested loop, which is that the current state s reaches the terminal state.

According to the Banach fixed-point theorem, the above SARSA algorithm converges to an optimized solution for the action value function $Q^\pi(s, a)$. The solution identifies actions that are to be taken, and these actions form the recipe for selecting from which buckets chips are taken for forming units of a multi-chip apparatus.

The above SARSA algorithm can be executed a number of times to achieve a stable solution with some degree of confidence. The action value function $Q^\pi(s, a)$ determined by an iteration of the SARSA algorithm and the policy $\pi(a|s)$ determined by the iteration of the SARSA algorithm can be used to initialize the action value function $Q^\pi(s, a)$ and the policy $\pi(a|s)$ for any subsequent iteration of the SARSA algorithm.

Some examples, such as described above, can achieve a higher yield in manufacturing units of a multi-chip apparatus. The buckets can be defined more appropriately for chips that are to be used in the units of the multi-chip apparatus because the buckets can be dynamically defined, as opposed to statically defined regardless of the chips that are to be used. Thus, yield of the units of the multi-chip apparatus meeting a power and performance specification can increase, and the formed units of the multi-chip apparatus can be less sensitive to process variations in manufacturing the chips.

Additionally, in some examples, chips that are categorized at a same speed grade can be used in forming units of a multi-chip apparatus. Even further, in some examples, chips that are categorized at different speed grades can be used in forming units of a multi-chip apparatus. Yield can further be increased when identifying buckets of chips at different speed grades from which chips are taken (e.g., cross-speed) to form units of a multi-chip apparatus. With an effective wafer selection process, the yield can be even higher with the flexibility of pairing high power buckets with more low power buckets and the increased possibility of more optimized recipes.

In some cases, e.g., like a unique demand, unique test and binning requirements for a multi-chip apparatus may be implemented. The Markov Decision Process algorithm can be used in such cases, since the algorithm can be flexible and can have a short run time. For example, a Markov Decision Process algorithm can permit meeting tighter power and performance specifications for multi-chip apparatuses in order to meet a unique demand. In other cases, if a higher power and performance specification can be tolerated, a Markov Decision Process can provide guidance as to how much looser the power and performance specification can be in order to achieve a high yield.

Figure 5:
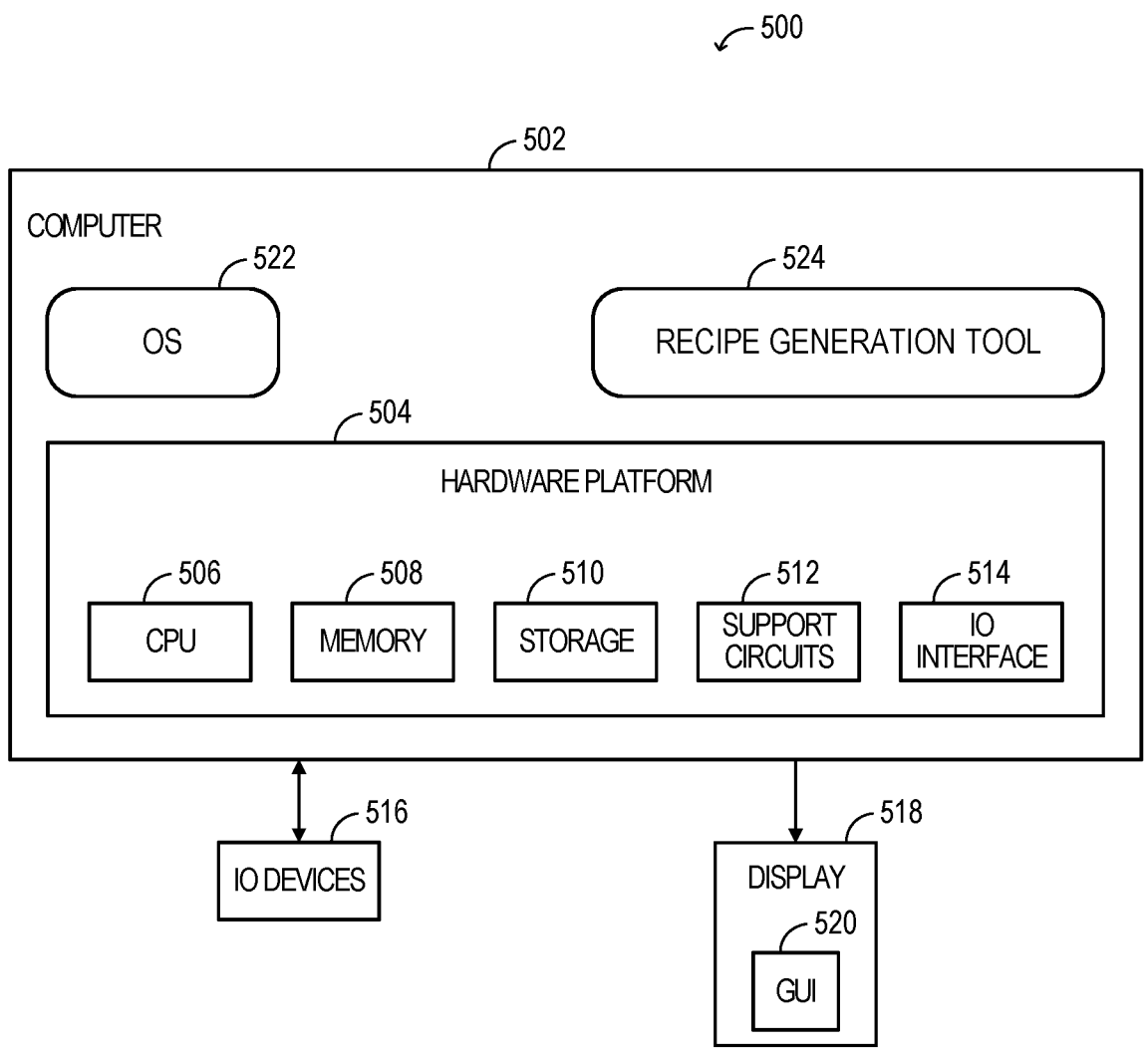
FIG. 5 is a block diagram depicting an example of a recipe generation system according to some examples.

FIG. 5 is a block diagram depicting an example of a recipe generation system 500, in accordance with some examples. The recipe generation system 500 (e.g., a processor-based system) can be used by a user to select wafers at block 208 and for recipe generation at block 209 (including to generate a recipe at block 210, bin chips at block 212, and/or generate a recipe at block 214) of FIG. 2, for example. The recipe generation system 500 includes a computer 502 coupled to input/output (IO) devices 516 and a display 518. The computer 502 includes a hardware platform 504 that can include components of a computing device, such as a central processing unit (CPU) 506, system memory 508, storage 510, various support circuits 512, and an IO interface 514. The CPU 506 can include one or more microprocessors. The CPU 506 is configured to execute program instruction code that performs one or more operations described herein, such as the operations at blocks 208-214. The program instruction code can be stored in system memory 508, storage 510, or any other memory in the hardware platform 504 (e.g., cache memory). The system memory 508 includes one or more non-transitory storage mediums that store information and can include, for example, random access memory (RAM), read-only memory (ROM), or a combination thereof. The storage 510 includes one or more local non-transitory storage mediums, such as hard disks, flash memory modules, solid state disks, optical disks, and the like. The storage 510 can also include interface(s) configured for communication with one or more network data storage systems. The support circuits 512 can include cache, power supplies, clock circuits, data registers, IO interfaces, and the like. The IO interface 514 includes interfaces to/from the computer 502. The IO interface 514 can be coupled to the IO devices 516, which can include a keyboard, mouse, and the like. The IO interface 514 can also be coupled to the display 518, which can present a graphical user interface (GUI) 520 to a user.

The computer 502 further includes a software platform comprising an operating system (OS) 522 and a recipe generation tool 524. The OS 522 and the recipe generation tool 524 include program instruction code that is executed by the CPU 506, which program instruction code can be stored in system memory 508, storage 510, or any other memory. The OS 522 can include any known operating system, such as Linux®, Microsoft Windows®, Mac OS®, and the like. The recipe generation tool 524 is an application that executes within the OS 522, which provides an interface to the hardware platform 504. Some operations of the recipe generation tool 524 are described above such as with respect to blocks 208-214 of FIG. 2 and the example pseudocode.

In some examples, the chips incorporated into a multi-chip apparatus have a same integrated circuit (IC) hardware design. For example, each of the chips 102-108 of FIG. 1 can have a same programmable IC, such as a field programmable gate array (FPGA). The multiple, same programmable ICs of the chips 102-108 can be logically connected into a larger circuit comprising the cumulative functionality of the programmable ICs. In other examples, different ICs can be implemented on any of the chips 102-108 of FIG. 1. As stated previously, more or fewer chips may be incorporated into a multi-chip apparatus, and any chip can have any IC, which may be the same or different from any other IC of a chip in the multi-chip apparatus.

Figure 6:
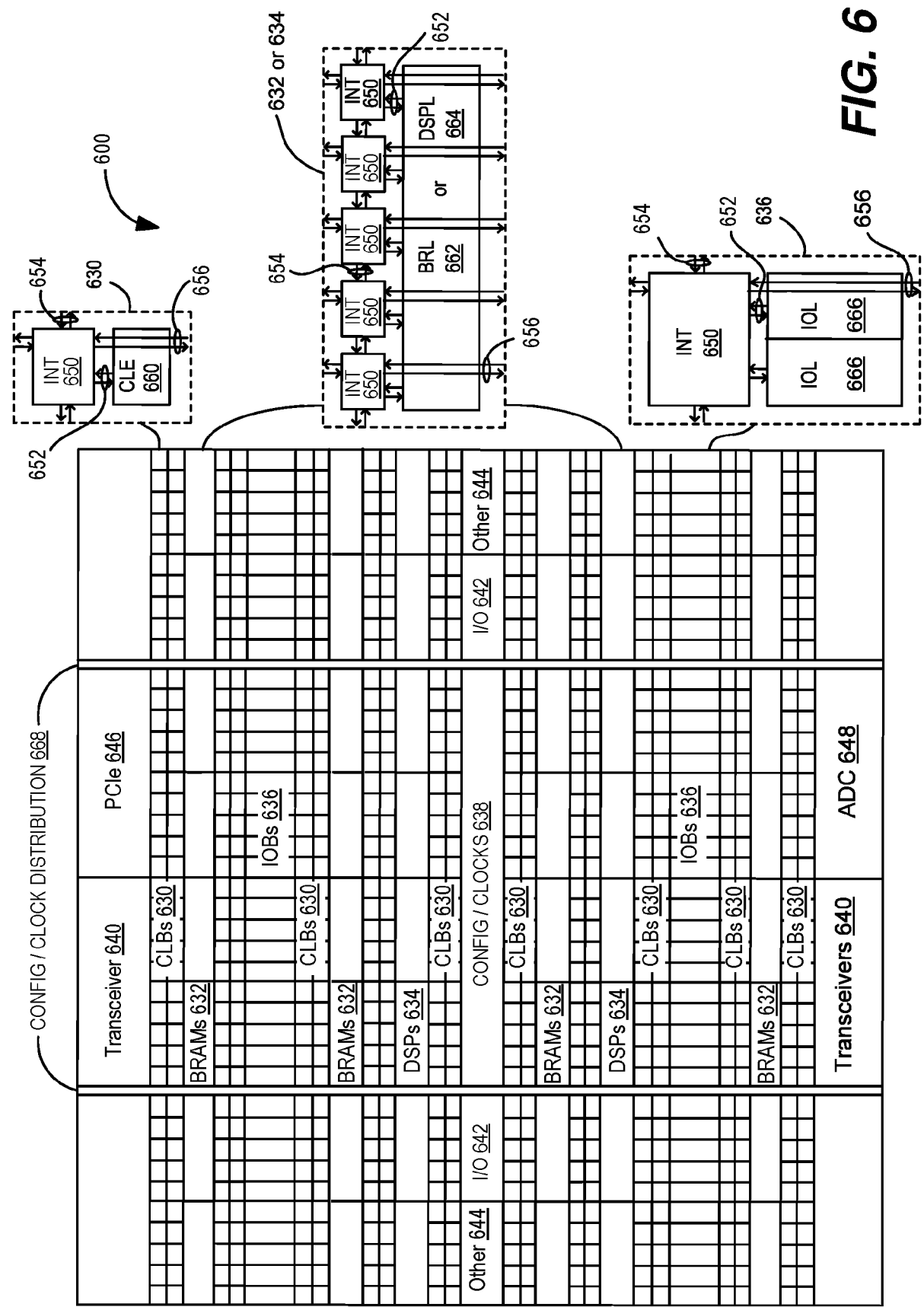
FIG. 6 illustrates a field programmable gate array (FPGA) of a programmable integrated circuit (IC) that may be on any chip of a multi-chip apparatus according to some examples.

FIG. 6 illustrates a FPGA of a programmable IC 600 that may be on any chip of a multi-chip apparatus, such as described above with respect to FIG. 1, according to some examples. For example, each of the chips 102-108 has the programmable IC 600.

The programmable IC 600 includes a large number of different programmable tiles including configurable logic blocks ("CLBs") 630, random access memory blocks ("BRAMs") 632, signal processing blocks ("DSPs") 634, input/output blocks ("IOBs") 636, configuration and clocking logic ("CONFIG/CLOCKS") 638, digital transceivers 640, specialized input/output blocks ("I/O") 642 (e.g., configuration ports and clock ports), and other programmable logic 644 such as digital clock managers, system monitoring logic, and so forth. The FPGA can also include PCIe interfaces 646, analog-to-digital converters (ADC) 648, and the like.

In some FPGAs, each programmable tile can include at least one programmable interconnect element ("INT") 650 having connections to input and output terminals 652 of a programmable logic element within the same tile, as shown by examples included in FIG. 6. Each programmable interconnect element 650 can also include connections to interconnect segments 654 of adjacent programmable interconnect element(s) in the same tile or other tile(s). Each programmable interconnect element 650 can also include connections to interconnect segments 656 of general routing resources between logic blocks (not shown). The general routing resources can include routing channels between logic blocks (not shown) comprising tracks of interconnect segments (e.g., interconnect segments 656) and switch blocks (not shown) for connecting interconnect segments. The interconnect segments of the general routing resources (e.g., interconnect segments 656) can span one or more logic blocks. The programmable interconnect elements 650 taken together with the general routing resources implement a programmable interconnect structure ("programmable interconnect") for the illustrated FPGA.

In an example implementation, a CLB 630 can include a configurable logic element ("CLE") 660 that can be programmed to implement user logic plus a single programmable interconnect element ("INT") 650. A BRAM 632 can include a BRAM logic element ("BRL") 662 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 634 can include a DSP logic element ("DSPL") 664 in addition to an appropriate number of programmable interconnect elements. An IOB 636 can include, for example, two instances of an input/output logic element ("IOL") 666 in addition to one instance of the programmable interconnect element 650. As will be clear to those of skill in the art, the actual I/O pads connected, for example, to the input/output logic element 666 typically are not confined to the area of the input/output logic element 666.

In the pictured example, a horizontal area near the center of the die is used for configuration, clock, and other control logic. Vertical columns 668 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A method of forming units of a multi-chip apparatus, the method comprising:
   using a processor-based system, and using a Markov Decision Process:
      defining buckets based on respective characteristics of manufactured chips;
      binning each of the manufactured chips into a respective one of the buckets based on the characteristic of the respective manufactured chip; and
      generating a recipe for identifying from which of the buckets to take one or more of the manufactured chips to incorporate into respective ones of the units of the multi-chip apparatus.

2. The method of claim 1, wherein the Markov Decision Process includes using a reinforcement learning method.

3. The method of claim 1, wherein the Markov Decision Process includes using a State-Action-Reward-State-Action (SARSA) algorithm.

4. The method of claim 3, wherein the SARSA algorithm is configured to maximize an action value function or an approximation thereof.

5. The method of claim 3, wherein the SARSA algorithm is configured to maximize a state value function or an approximation thereof.

6. The method of claim 1, wherein each of the buckets corresponds to a respective range of a distribution of the respective characteristics of the manufactured chips.

7. The method of claim 1, wherein each of the buckets corresponds to a distribution of respective static power consumption of the manufactured chips.

8. The method of claim 1, wherein the manufactured chips are manufactured in groups, and wherein each group of manufactured chips is manufactured on a respective wafer, the method further comprising, using the processor-based system:
   selecting one or more of the wafers based on the characteristics of the respective manufactured chips; and
   performing the defining, the binning, and the generating with respect to the manufactured chips of the one or more selected wafers.

9. A recipe generation system comprising:
   a processor; and
   a memory coupled to the processor, the memory storing instruction code, the processor being configured to execute the instruction code to:
      using a Markov Decision Process:
         define buckets based on respective characteristics of manufactured chips;
         bin each of the manufactured chips into a respective one of the buckets based on the characteristic of the respective manufactured chip; and
         generate a recipe for identifying from which of the buckets to take one or more of the manufactured chips to incorporate into respective ones of units of a multi-chip apparatus, generating the recipe comprising.

10. The recipe generation system of claim 9, wherein the Markov Decision Process includes using a reinforcement learning method.

11. The recipe generation system of claim 9, wherein the Markov Decision Process includes using a State-Action-Reward-State-Action (SARSA) algorithm.

12. The recipe generation system of claim 11, wherein the SARSA algorithm is configured to maximize an action value function or an approximation thereof.

13. The recipe generation system of claim 11, wherein the SARSA algorithm is configured to maximize a state value function or an approximation thereof.

14. The recipe generation system of claim 9, wherein each of the buckets corresponds to a respective range of a distribution of the respective characteristics of the manufactured chips.

15. The recipe generation system of claim 9, wherein each of the buckets corresponds to a distribution of respective static power consumption of the manufactured chips.

16. A method for manufacturing, the method comprising:
    manufacturing groups of chips on respective wafers;
    obtaining a characteristic of each of the chips by testing each of the chips;
    selecting a subset of the wafers based on the characteristics of the chips of the respective wafers;
    binning each of the chips of the subset of the wafers into a respective bucket of a plurality of buckets based on the characteristic of the respective chip;
    generating a recipe that identifies from which of the buckets to take one or more of the chips to incorporate into respective ones of the units of the multi-chip apparatus, using a Markov Decision Process; and
    forming units of a multi-chip apparatus comprising incorporating chips taken from respective buckets identified by the recipe.

17. The method of claim 16, wherein selecting the subset of the wafers comprises using a Greedy algorithm based on the characteristic of each of the chips on the wafers.

18. The method of claim 16 further comprising, using the Markov Decision Process, dynamically defining each of the buckets based on the respective characteristics of the chips on wafers of the subset of the wafers.

19. The method of claim 16, wherein the Markov Decision Process includes using a reinforcement learning method.

20. The method of claim 16, wherein the Markov Decision Process includes using a State-Action-Reward-State-Action (SARSA) algorithm.

* * * * *